(12) United States Patent
Tsai

(10) Patent No.: US 10,993,304 B2
(45) Date of Patent: Apr. 27, 2021

(54) WIRE, STRIPPING METHOD AND LIGHT STRIP

(71) Applicant: Cosmo Lighting Inc., Walnut, CA (US)

(72) Inventor: Nai-Chen Tsai, New Taipei (TW)

(73) Assignee: COSMO LIGHTING INC., Walnut, CA (US)

(*) Notice: Subject to any disclaimer, the term of this patent is extended or adjusted under 35 U.S.C. 154(b) by 244 days.

(21) Appl. No.: 16/059,923

(22) Filed: Aug. 9, 2018

(65) Prior Publication Data
US 2019/0103736 A1    Apr. 4, 2019

Related U.S. Application Data

(60) Provisional application No. 62/584,619, filed on Nov. 10, 2017, provisional application No. 62/565,327, filed on Sep. 29, 2017.

(51) Int. Cl.
*H05B 45/48*    (2020.01)
*B29C 39/10*    (2006.01)
(Continued)

(52) U.S. Cl.
CPC .......... *H05B 45/48* (2020.01); *B23K 26/364* (2015.10); *B23K 26/382* (2015.10); *B29C 33/12* (2013.01); *B29C 33/42* (2013.01); *B29C 39/10* (2013.01); *B65H 54/14* (2013.01); *F21K 9/90* (2013.01); *F21S 4/10* (2016.01); *F21S 4/26* (2016.01); *F21V 17/04* (2013.01); *F21V 19/001* (2013.01); *F21V 19/0025* (2013.01); *F21V 23/001* (2013.01); *G06F 1/26* (2013.01);
(Continued)

(58) Field of Classification Search
CPC .. F21K 9/90; F21V 17/04; H01B 7/02; H01B 13/003; H01B 13/0036; H01B 13/06; H01R 43/28; H02G 1/1256; B23K 26/382; H01L 51/0009
See application file for complete search history.

(56) References Cited

U.S. PATENT DOCUMENTS

| | | | | |
|---|---|---|---|---|
| 3,794,522 A | * | 2/1974 | Mueller | ............... B08B 7/028 |
| | | | | 134/1 |
| 4,931,616 A | * | 6/1990 | Usui | .................. H02G 1/128 |
| | | | | 219/121.68 |

(Continued)

FOREIGN PATENT DOCUMENTS

| | | |
|---|---|---|
| CN | 101378876 A | 3/2009 |
| CN | 104412473 A | 3/2015 |

(Continued)

*Primary Examiner* — Peter Dungba Vo
*Assistant Examiner* — Jeffrey T Carley
(74) *Attorney, Agent, or Firm* — Li & Cai Intellectual Property (USA) Office

(57) ABSTRACT

A wire and a stripping method thereof, and a light strip are provided. The stripping method includes the following steps: holding a wire by a holder, the wire including an insulation layer and a conductor covered by the insulation layer; mounting the holder on a worktable of a an optical device; and activating a light emitter of the optical device to emit a light beam irradiating onto the insulation layer to ablate a portion of the insulation layer to form at least one through hole that penetrates the insulation layer to expose a portion of the conductor.

5 Claims, 7 Drawing Sheets

(51) Int. Cl.
$\quad$ B29C 33/12 $\quad$ (2006.01)
$\quad$ F21K 9/90 $\quad$ (2016.01)
$\quad$ H02J 7/00 $\quad$ (2006.01)
$\quad$ H05B 45/00 $\quad$ (2020.01)
$\quad$ H05B 45/10 $\quad$ (2020.01)
$\quad$ H05B 45/40 $\quad$ (2020.01)
$\quad$ B23K 26/382 $\quad$ (2014.01)
$\quad$ B23K 26/364 $\quad$ (2014.01)
$\quad$ H01M 50/20 $\quad$ (2021.01)
$\quad$ F21S 4/10 $\quad$ (2016.01)
$\quad$ B29C 33/42 $\quad$ (2006.01)
$\quad$ F21V 17/04 $\quad$ (2006.01)
$\quad$ F21V 19/00 $\quad$ (2006.01)
$\quad$ F21V 23/00 $\quad$ (2015.01)
$\quad$ F21S 4/26 $\quad$ (2016.01)
$\quad$ B65H 54/14 $\quad$ (2006.01)
$\quad$ H01L 21/67 $\quad$ (2006.01)
$\quad$ H01L 25/075 $\quad$ (2006.01)
$\quad$ H01L 33/52 $\quad$ (2010.01)
$\quad$ H01L 33/62 $\quad$ (2010.01)
$\quad$ H01L 25/13 $\quad$ (2006.01)
$\quad$ H01L 33/00 $\quad$ (2010.01)
$\quad$ H02G 1/12 $\quad$ (2006.01)
$\quad$ G06F 1/26 $\quad$ (2006.01)
$\quad$ F21Y 115/10 $\quad$ (2016.01)
$\quad$ F21Y 103/10 $\quad$ (2016.01)

(52) U.S. Cl.
$\quad$ CPC .. H01L 21/67144 (2013.01); H01L 21/67259 (2013.01); H01L 25/0753 (2013.01); H01L 25/13 (2013.01); H01L 33/00 (2013.01); H01L 33/52 (2013.01); H01L 33/62 (2013.01); H01M 50/20 (2021.01); H02G 1/1256 (2013.01); H02J 7/007184 (2020.01); H05B 45/00 (2020.01); H05B 45/10 (2020.01); H05B 45/40 (2020.01); F21Y 2103/10 (2016.08); F21Y 2115/10 (2016.08); H01L 2933/005 (2013.01); H01L 2933/0033 (2013.01); H01L 2933/0066 (2013.01)

(56) References Cited

U.S. PATENT DOCUMENTS

| | | | | |
|---|---|---|---|---|
| 6,326,587 | B1* | 12/2001 | Cardineau | H02G 1/128 |
| | | | | 219/121.68 |
| 7,947,921 | B2* | 5/2011 | McFall | H02G 1/128 |
| | | | | 219/121.69 |
| 10,239,159 | B2* | 3/2019 | Evans | B23K 26/123 |
| 2008/0098598 | A1* | 5/2008 | McFall | H01R 43/28 |
| | | | | 29/868 |
| 2008/0200089 | A1* | 8/2008 | Tsai | F21S 4/10 |
| | | | | 445/35 |
| 2010/0201586 | A1* | 8/2010 | Michalk | H02G 1/1248 |
| | | | | 343/741 |
| 2011/0034101 | A1* | 2/2011 | Tsai | F21S 4/10 |
| | | | | 445/23 |
| 2016/0351292 | A1* | 12/2016 | Toth | H01B 7/0846 |

FOREIGN PATENT DOCUMENTS

| | | |
|---|---|---|
| JP | 2928634 B2 | 8/1999 |
| JP | 3796159 B2 | 7/2006 |
| JP | 2008188661 A | 8/2008 |

* cited by examiner

WIRE, STRIPPING METHOD AND LIGHT STRIP

FIELD OF THE DISCLOSURE

The prevent disclosure involves a wire processing field, and more particularly to a stripping method, a wire having through holes formed by using the stripping method, and a light strip including the wire.

BACKGROUND OF THE DISCLOSURE

With the rapid development of processing technology, the integrated circuit technology has been continuously improved in various industrial fields. A quality of connection between the electronic devices is very important, the stripping process being a key factor thereof. The conventional stripping technology using a mechanical tool such as a grinding wheel adopts a contact-type process, which can easily cause an incomplete stripping of an insulation layer a wire or excessive abrasion that damages a conductor of a wire, resulting in a low yield and an unstable quality. Furthermore, in the conventional stripping technology, the mechanical tools need to be adjusted to have different stripping forces for insulating layers having different thicknesses during processes of stripping the insulating layers of the wires, which may cause a cutting efficiency to be affected and the mechanical tools to be easily worn out, such that the mechanical tools are often in need of replacement.

SUMMARY OF THE DISCLOSURE

An object of the present disclosure is to provide a stripping method, a wire having a through hole by using the wire stripping method, and a light strip including the wire, which can prevent from damaging or affecting the quality of the conductor covered by the insulating layer during processes of stripping the insulating layers of the wires.

The present disclosure provides a stripping method, including: holding a wire by a holder, the wire including an insulation layer and a conductor covered by the insulation layer; mounting the holder on a worktable of an optical device; and activating a light emitter of the optical device to emit a light beam toward the worktable to illuminate the insulating layer, thereby ablating a portion of the insulating layer to form at least one through hole, which penetrates the insulating layer to expose a portion of the conductor.

The present disclosure provides a wire, including an insulating layer and a conductor, wherein the insulating layer has at least one through hole, the conductor is covered by parts of the insulating layer outside the through hole that is formed by using a stripping process. The stripping process includes: holding the wire by a holder; mounting the holder on a worktable of an optical device; and activating a light emitter of the optical device to emit a light beam toward the worktable to illuminate the insulating layer, thereby ablating a portion of the insulating layer to form the through hole, which penetrates the insulating layer to expose a portion of the conductor.

The present disclosure provides a light strip, including: a plurality of wires each including an insulating layer and a conductor, the insulating layer having at least one through hole, the conductor being covered by parts of the insulating layer outside the through hole; and a plurality of light-emitting elements each having a positive pin and a negative pin that are connected to the two conductors of the two wires through the through holes of the two wires. The positive pin of at least one of the plurality of light-emitting elements and the negative pin of at least another one of the plurality of light-emitting elements are connected to the conductor of the same wire via the two through holes of the same wire, respectively, wherein the through hole is formed by using a stripping process. The stripping process includes: holding the wire by a holder; mounting the holder on a worktable of an optical device; and activating a light emitter of the optical device to emit a light beam toward the worktable to illuminate the insulating layer to ablate a portion of the insulating layer to form at least one through hole, which penetrates the insulating layer to expose a portion of the conductor.

As described above, the present disclosure applies the non-contact ablating method, for example, the insulating layer by which the wire conductor is covered is ablated by the optical device such as a laser device, instead of a contact method of grinding the insulating layer of the wire with a mechanical tool such as a grindstone, to form the through holes in the insulating layer of the wire. Therefore, the present disclosure can avoid deterioration or negative impact on a quality of the metal wire conductor and improve light-emitting effect of the light device using the wires.

DETAILED DESCRIPTION OF THE EXEMPLARY EMBODIMENTS

Figure 1:
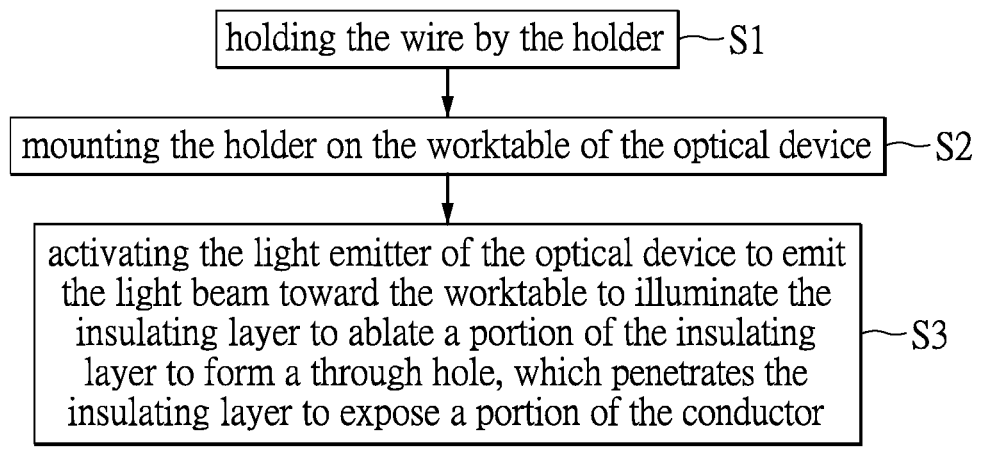
FIG. 1 is a schematic flowchart of a first embodiment of a stripping method of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, a schematic flowchart of a first embodiment of a stripping method of the present disclosure is shown. As shown in FIG. 1, the stripping method includes the following steps S1 to S3.

In step S1, a wire is held by a holder, for example, the wire is winded around the holder. The number of coils and spacing therebetween may depend on a cross-sectional perimeter of the holder and lengths of the holder and the wire. The wire includes an insulating layer and a conductor covered by the insulating layer.

In step S2, the holder is mounted on a worktable of an optical device.

In step S3, a light emitter of the optical device is activated to emit a light beam toward the worktable to irradiate the insulating layer to ablate a portion of the insulating layer to form at least one through hole, which penetrates the insulating layer to expose a portion of the conductor.

The present disclosure is not limited to only one holder in step S2. In practice, a plurality of holders may be mounted on the worktable at the same time for holding a plurality of wires respectively, the holders may have a rectangular shape and be arranged in parallel to each other to facilitate the light emitter to simultaneously or sequentially ablate a plurality of insulating layers of the plurality of wires to form a plurality of through holes in step S3.

As an example of the ablating method, when only one holder is mounted on the worktable to hold one wire, the light emitter of the optical device may continuously or simultaneously emit a plurality of light beams toward the worktable to illuminate different positions on the insulating layer of the same wire, thereby ablating continuously or simultaneously parts of the insulating layer at parts of a plurality of segments of the same wire to form a plurality of through holes, which may have same or different shape and size. For another example, when a plurality of holders are mounted on the worktable to hold a plurality of wires respectively at the same time, the light emitter of the optical device may be manipulated to continuously or simultaneously ablate parts of the insulating layer at parts of a plurality of segments of one of the plurality of wires respectively, and then to continuously or simultaneously ablate parts of the insulating layer at parts of a plurality of segments of another wire respectively. Alternatively, the light emitter of the optical device may be manipulated to simultaneously ablate a first segment of each of the plurality wires, where the plurality of first segments of the plurality of wires are aligned with each other to form a plurality of first through holes respectively, and then to simultaneously ablate a second segment of each of the plurality wires, where the plurality of second segments of the plurality of wires are aligned with each other to form a plurality of second through holes respectively. Other segments of the wires are ablated by using a similar ablating method as described above.

As described above, in the embodiment of the present disclosure, as at the above step S3, a non-contact ablating method is implemented, for example, ablating the insulating layer by which the wire conductor is covered by the optical device such as a laser device, instead of a contact-type ablating method of grinding the insulating layer of the wire with a mechanical tool such as a grindstone, to form the through holes in the insulating layer of the wire to expose parts of the wire conductors. Therefore, the embodiment of the present disclosure can avoid deterioration or negative impact on a quality of the metal wire conductor.

Figure 2:
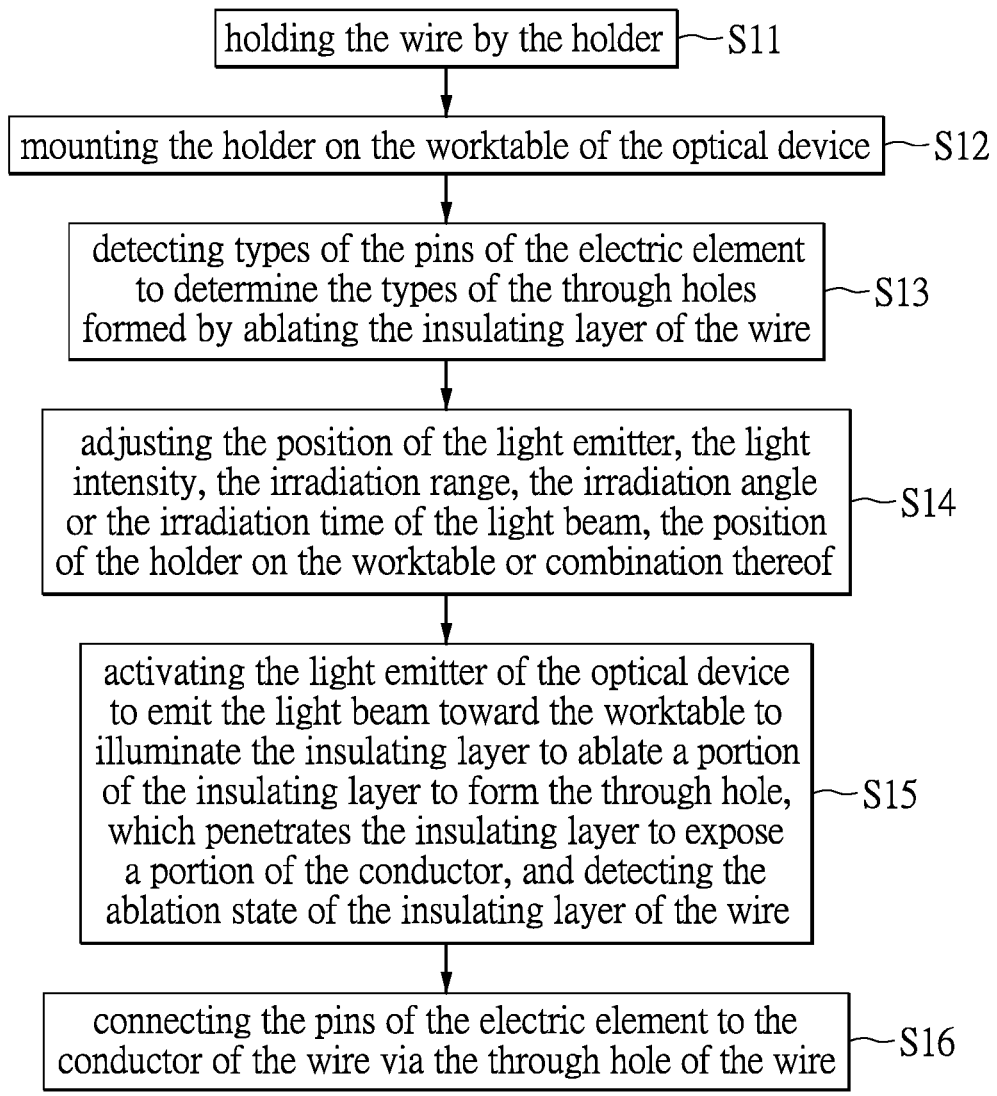
FIG. 2 is a schematic flowchart of a second embodiment of a stripping method of the present disclosure.

Referring to FIG. 2, a schematic flowchart of a second embodiment of a stripping method of the present disclosure is shown. As shown in FIG. 2, the stripping method includes the following steps S11 to S16.

In step S11, a wire is held by the holder, for example, the wire is winded around the holder. The spacing and number of coils not only depend on the cross-sectional perimeter of the holder and the lengths of the holder and the wire, but also depend on a width of an electric element to be bonded to the wire in step S16. The wire includes the insulating layer and the conductor covered by the insulating layer.

At step S12, the holder is mounted on the worktable of the optical device.

In step S13, an image of the electric element such as a light-emitting diode (LED) is captured by an image capturing module such as a photographic camera or a surveillance camera, and is recognized by a processor for detecting types of a plurality of pins of the electric element, such as shapes and sizes of positive and negative pins of the light-emitting diode, and accordingly determines types of the plurality of through holes to be formed by ablating the insulation layer of the wire, such as lengths, widths, depths and other features of the through holes. The above detecting method is only illustrative, and the present disclosure is not limited thereto.

In step S14, a location, a time, a depth, an area or a combination thereof of ablating the insulating layer of the wire by the light emitter are determined, and a position of the light emitter, a light intensity, an irradiation range, an irradiation angle or an irradiation time of the light beam, a position of the holder on the worktable or combination thereof are adjusted according thereto.

In step S15, the light emitter of the optical device is activated to emit a light beam onto the insulating layer toward the worktable to ablate a portion of the insulating layer to form at least one through hole that penetrates the insulating layer to expose a portion of the conductor, and meanwhile, a ablation state of the insulating layer of the wire is detected.

In step S16, the pins of the electronic element are connected to a plurality of conductors respectively through the plurality of through holes of the plurality of wires.

It should be understood that, in the embodiment, in step S15, only a portion of the insulating layer of the wire is ablated. That is, only a portion of the insulating layer is stripped, such that the electronic component may be bonded to the wire conductor in step S16. However, if necessary, the entire insulation layer of the wire may be stripped. The number of the through holes formed by ablating the insulating layers of the wires may depend on a number of electronic elements to be bonded to the wires in step S16.

As described above, the types of the positive pin and the negative pin of the electric element such as the light-emitting diode to be bonded to the wires are measured in step S13, and the optical device is adjusted according to the measuring result and the states of the through holes formed by the optical device at the same time in step S15 before step 16 of ablating of the insulating layer of the wire, such that the desired through holes are formed more precisely and more cost effectively in the insulating layer of the wire. Further, in the embodiment of the present disclosure, as at the above step S15, the non-contact ablating method is implemented, for example, ablating the insulating layer by which the wire conductor is covered by the optical device such as a laser device, instead of a contact-type method of grinding the insulating layer of the wire with a mechanical tool such as a grindstone, to form the through holes in the insulating layer of the wire to expose parts of the wire conductors. Therefore, the embodiment of the present disclosure can avoid deterioration or negative impact on a quality of the metal wire conductor.

It should be understood that additional steps may be added, one or more steps may be omitted from steps S11 to S16, and an order of performing steps S11 to S16 may be adjusted according to implementation requirements, and the present disclosure is not limited thereto. For example, step S14 and S15 may actually be performed simultaneously. More specifically, when the light emitter of the optical device irradiates a light beam such as a laser beam onto the insulating layer, the holder mounted on the worktable for holding the wire may be conveyed forward or backward in an ablating direction according to the detecting result in step S15, thereby automatically adjusting a relative position of the light emitter of the optical device and the wire, such that the light beam emitted by the light emitter may be irradiated to different positions on the wire to respectively form a through hole at each of the segments of the wire, that is, removing the insulation layer at each of the segments of the wire. Therefore, the need for manual labor can be decreased, and the use of automated adjustments can prevent incomplete stripping problems and mistakes from occurring in manual operation.

Figure 3:
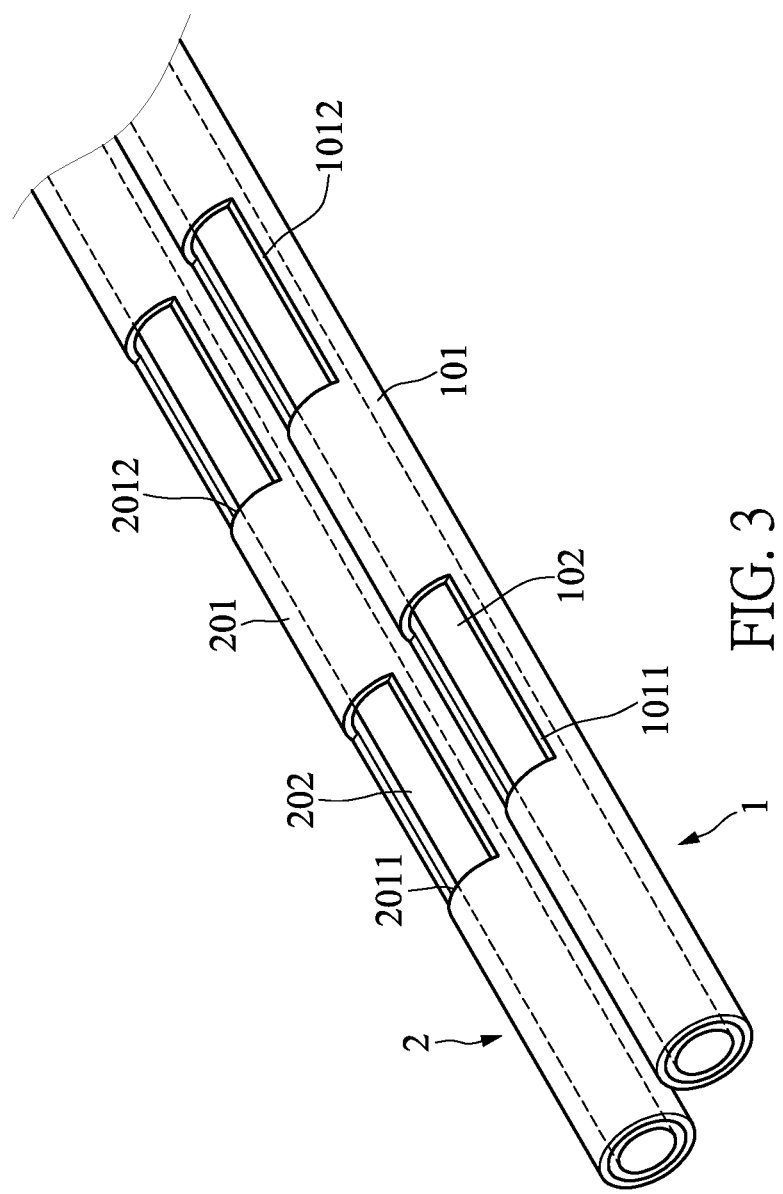
FIG. 3 is a schematic structural diagram of an embodiment of a wire of the present disclosure.

Referring to FIG. 3, a schematic structural diagram of an embodiment of a wire of the present disclosure is shown. As shown in FIG. 3, the plurality of wires includes a first wire 1 including an insulating layer 101 and a conductor 102. The insulating layer 101 has through holes 1011 and 1012 that are formed by using the above-described stripping method of the first or second embodiment. After ablating the insulating layer 101 by using the above-mentioned stripping method, a part of the conductor 102 at a position corresponding to the ablated insulating layer 101 is exposed by the through holes 1011 and 1012 that are spaced from each other. Similarly, the second wire 2 includes an insulating layer 201 and a conductor 202. The insulating layer 201 has through holes 2011 and 2012, which are formed by using the above-described stripping method of the first or second embodiment. The conductor 202 is covered by the insulating layer 201 outside the through holes 2011 and 2012. More specifically, after ablating the insulating layer 201 by using the above-mentioned stripping method, a part of the conductor 202 at a position corresponding to the ablated insulating layer 201 is exposed by the through holes 2011 and 2012 that are spaced from each other.

The first wire 1 and the second wire 2 may be enameled wires, Teflon wires, PVC wires or other suitable wires. The conductor 102 of the first wire 1 and the conductor 202 of the second wire 2 may be made of copper materials. The through hole 1011 of the first wire 1 may be aligned with the through hole 2011 of the second wire 2, and the through hole 1012 of the first wire 1 may be aligned with the through hole 2012 of the second wire 2. A distance between the through hole 1011 and the through hole 1012 of the first wire 1 may be the same as a distance between the through hole 2011 and the through hole 2012 of the second wire 2. The through holes 1011 and 1012 of the first wire 1 and the through holes 2011 and 2012 of the second wire 2 may have the same or different areas, depths, shapes or other features. The above descriptions are only exemplary embodiments, and the present disclosure is not limited thereto. In practice, those features may be adaptively changed by adjusting the above-described stripping method.

Figure 4:
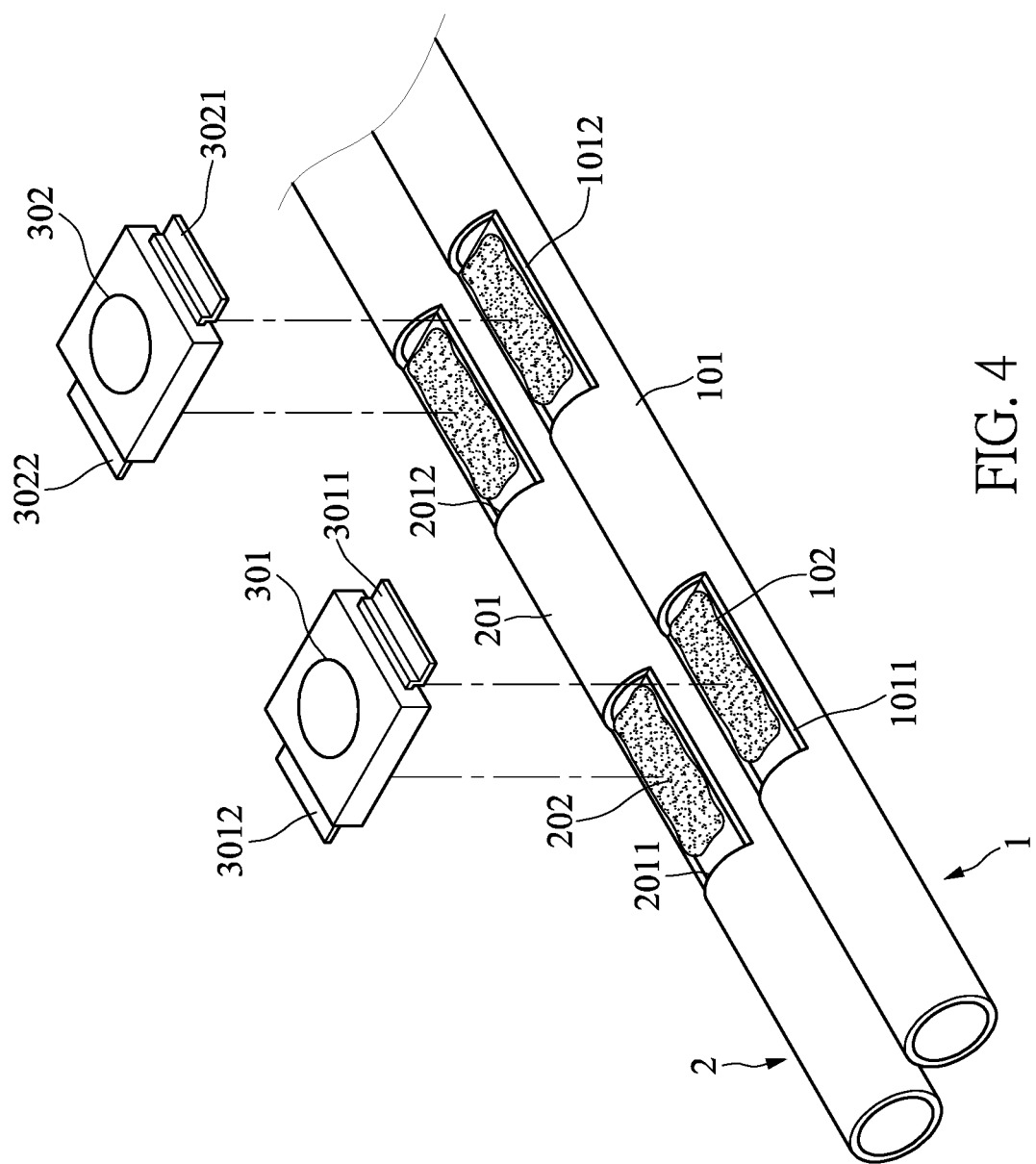
FIG. 4 is a schematic structural diagram of a first embodiment of a light strip of the present disclosure.

Referring to FIG. 4, a schematic structural diagram of a first embodiment of a lamp according to the present disclosure is shown. In the embodiment shown in FIG. 4, the light strip includes a first wire 1 and a second wire 2, and a first light-emitting element 301 and a second light-emitting element 302. The first wire 1 and the second wire 2 of this embodiment may be as same as that of the embodiment of FIG. 3. The first wire 1 and the second wire 2 are bonded to the first light-emitting element 301 and the second light-emitting element 302. The first wire 1 includes an insulating layer 101 and a conductor 102. The insulating layer 101 has through holes 1011 and 1012 that are formed by using the above-described stripping method of the first or second embodiment. Similarly, the second wire 2 includes an insulating layer 201 and a conductor 202. The insulating layer 201 has through holes 2011 and 2012 that are formed by using the above-described stripping method of the first or second embodiment. For example, the first light-emitting element 301 and the second light-emitting element 302 may be light-emitting diodes, but the present disclosure is not limited thereto.

The first light-emitting element 301 has pins 3011 and 3012. The pin 3011 of the first light-emitting element 301 is connected to the conductor 102 of the first wire 1 through the through hole 1011 of the first wire 1, and the pin 3012 of the first light-emitting element 301 is connected the conductor 202 of the second wire 2 through the through hole 2011 of the second wire 2. The second light-emitting element 302 has pins 3021 and 3022. The pin 3021 of the second light-emitting element 302 is connected to the conductor 102 of the first wire 1 through the through hole 1012 of the first wire 1, and the pin 3012 of the second light-emitting element 302 is connected the conductor 202 of the second wire 2 through the through hole 2012 of the second wire 2.

In the embodiment, a width of the through hole 1011 of the first wire 1 is larger than a width of the pin 3011 of the first light-emitting element 301, and a width of the through hole 2011 of the second wire 2 is larger than that of the pin 3012 of the first light-emitting element 301. Similarly, a width of the through hole 1012 of the first wire 1 is larger than a width of the pin 3021 of the second light-emitting element 302, and a width of the through hole 2012 of the second wire 2 is larger than a width of the pin 3022 of the second light-emitting element 302. The through holes 1011 and 1012 of the first wire 1 and the through holes 2011 and 2012 of the second wire 2 may be of the same type, such as having the same shape and size. However, the present disclosure is not limited to the above-mentioned types of the through holes 1011 and 1012 of the first wire 1 and the through holes 2011 and 2012 of the second wire 2. The setting parameters of the light emitter of the optical device performing the stripping method may be adjusted according to actual requirements, such as adjusting an irradiation range of the emitted light beam, thereby determining the types of the through hole 1011 of the first wire 1 and the through hole 2011 of the second wire 2, for example, by the widths and other features.

A conductive layer, for example, a solder such as solder sheets, solder balls or solder pastes that contains metals or metal alloys of In, Ag, Au, Si, Ge, Sn, Pd, etc., may be coated on the conductor 102 of the first wire 1 and the conductor 202 of the second wire 2, where the conductor 102 and the conductor 202 are exposed by the through hole 1011 of the first wire 1 and the through hole 2011 of the second wire 2 respectively. The pins 3011 and 3012 of the first light-emitting element 301 and the pins 3021 and 3022 of the second light-emitting element 302 may be conductively bonded to the conductor 102 of the first wire 1 and the conductor 202 of the second wire 2 via the coated conductive layer. It should be understood that a coating amount of the solder layer may depend on the features of the first light-emitting element 301, the second light-emitting element 302, the first wire 1 and the second wire 2.

Figure 5:
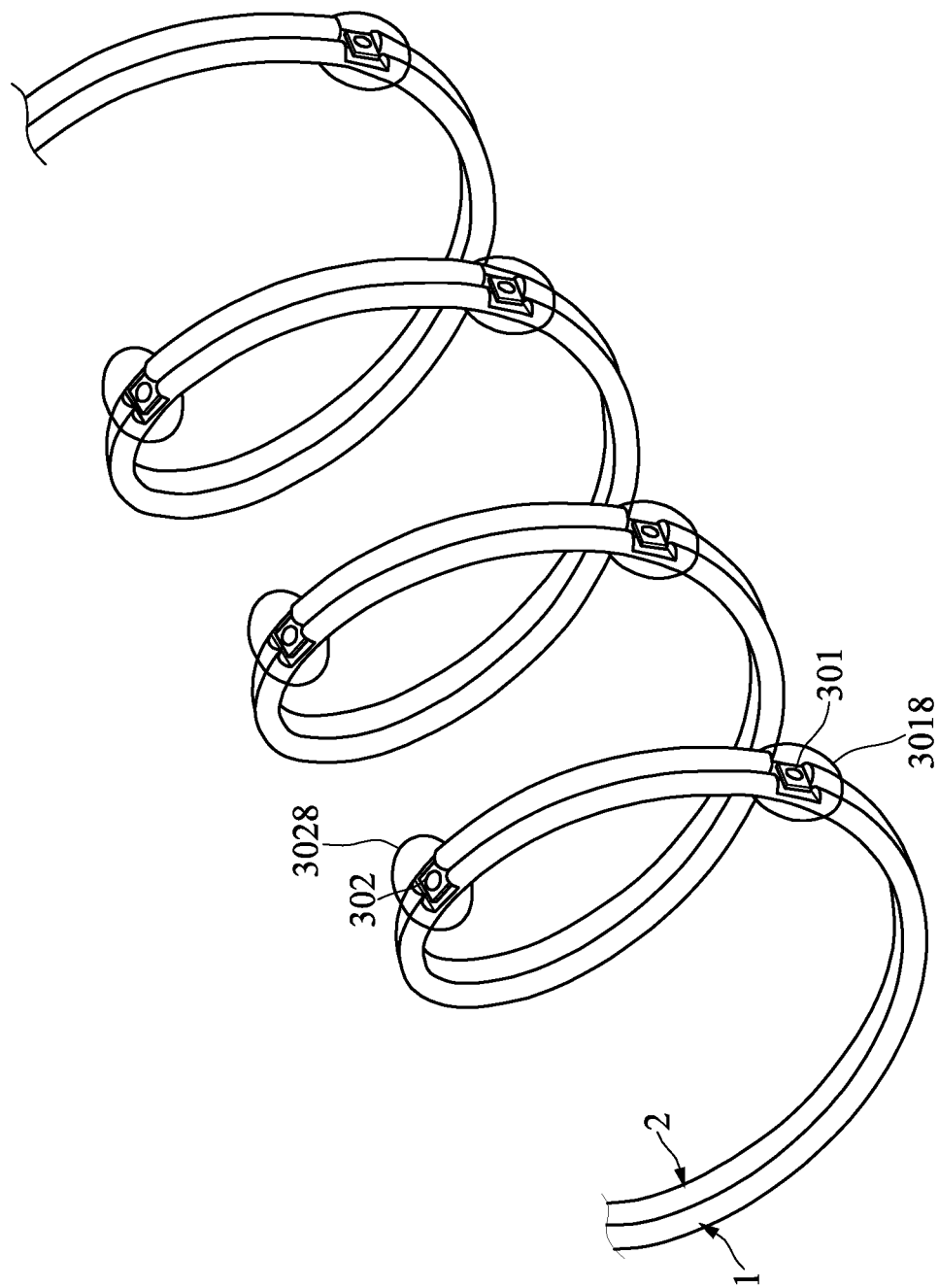
FIG. 5 is a schematic diagram of a second embodiment of a light strip of the present disclosure.

Referring to FIGS. 3 and 5, FIG. 3 is a structure diagram according to an embodiment of a wire of the present disclosure; FIG. 5 is a schematic diagram of a second embodiment of a light strip of the present disclosure, wherein the light strip includes the wire shown in FIG. 3. The light strip includes a plurality of wires and a plurality of light-emitting elements. As shown in FIGS. 3 and 5, the insulating layer 101 of the first wire 1 and the insulating layer 201 of the second wire 2 are bonded to each other. The plurality of light-emitting elements such as the first light-emitting element 301 and the second light-emitting element 302 are arranged at a fixed or non-fixed interval along an extending direction of the plurality of wires such as the first wire 1 and the second wire 2. As shown in FIG. 5, the first light-emitting element 301 and the second light-emitting element 302 are disposed across and connected to the first wire 1 and the second wire 2.

In addition, an encapsulation layer may be configured to prevent the light-emitting elements from being damaged. As shown in FIG. 5, the first wire 1 and the second wire 2 pass through the first encapsulation layer 3018 and the second encapsulation layer 3028 from one side of the encapsulation layer 3018 and 3028 to another side of the encapsulation layer 3018 and 3028. The first light-emitting element 301 and the second light-emitting element 302 are respectively covered by the first encapsulation layer 3018 and the second encapsulation layer 3028. Therefore, the first encapsulation layer 3018 and the second encapsulation layer 3028 may preferably be made of light-permeable materials, such that the light emitted by the first light-emitting element 301 and the second light-emitting element 302 may penetrate the first encapsulation layer 3018 and the second encapsulation layer 3028 respectively, thereby achieving an illumination effect.

It should be understood that the types and quantities of the above-mentioned encapsulation layers, light-emitting elements, and wires may be adjusted according to actual requirements. For example, the light-emitting elements may be covered with the same or different types of encapsulation layers, where the encapsulation layers of the same wire may have the same shape, such as an elliptical shape shown in FIG. 5. Alternately, the encapsulation layers may have different shapes for different holidays, such as shapes of Christmas trees, snowmen, or elks for Christmas, but the present disclosure is not limited thereto.

As described above, in the embodiments of the present disclosure, the wire used by the light strip has a plurality of through holes formed by the laser beam of the above-mentioned optical device. It is worth noting that those through holes are formed by using a non-contact ablating method. Therefore, the embodiments of the present disclosure can avoid deterioration or negative impact on a quality of the metal wire conductor.

Figure 6:
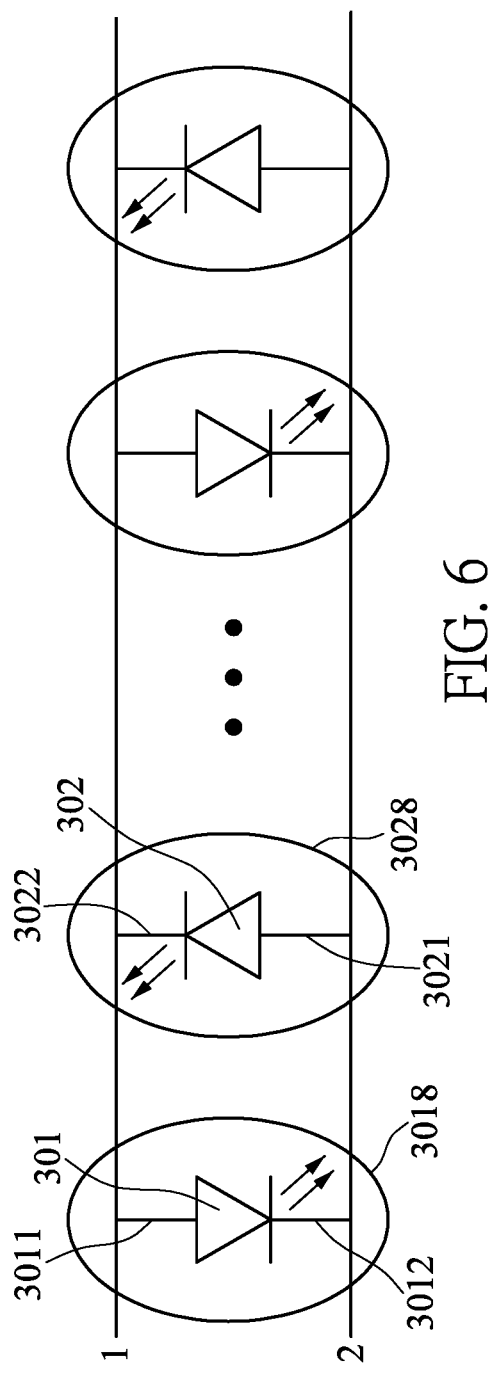
FIG. 6 is a circuit layout diagram of a third embodiment of a light strip of the present disclosure.

Referring to FIG. 6, a circuit layout diagram of a third embodiment of a light strip of the present disclosure is shown. As shown in FIG. 6, the light strip includes a first wire 1, a second wire 2, and a plurality of light-emitting elements such as a first light-emitting element 301 and a second light-emitting element 302, which are regularly arranged adjacent to each other and connected to the first wire 1 and the second wire 2. The first light-emitting element 301 includes a positive pin 3011 and a negative pin 3012. The second light-emitting element 302 includes a positive pin 3021 and a negative pin 3022. The positive pin 3011 of the first light-emitting element 301 and the negative pin 3022 of the second light-emitting element 302 are connected to the first wire 1. The negative pin 3012 of the first light-emitting element 301 and the positive pin 3021 of the second light-emitting element 302 are connected to the second wire 2. Therefore, in the embodiment, the LED string includes two wires forming two loops.

As described above, the conventional light strip uses the wires each having a fixed polarity to form a single loop, where the positive pins of all of the light-emitting elements are connected to the same wire, and the negative pins of all of the light-emitting elements are connected to the same wire. Therefore, the transitional light strip including wires having a common positive or negative polarity has the disadvantages of undesired emission, monotonous lighting effect, and single function. In contrast, in the embodiment of the present disclosure, the positive pins of the light-emitting elements and the negative pins of other light-emitting elements are connected to the same wire, and meanwhile, the negative pins of the light-emitting elements and the positive pins of the other light-emitting elements are connected to the same wire. Therefore, for the embodiment of the present disclosure, the light strip using the wires each having a non-fixed polarity can improve the above disadvantages of the transitional light strip.

Figure 7:
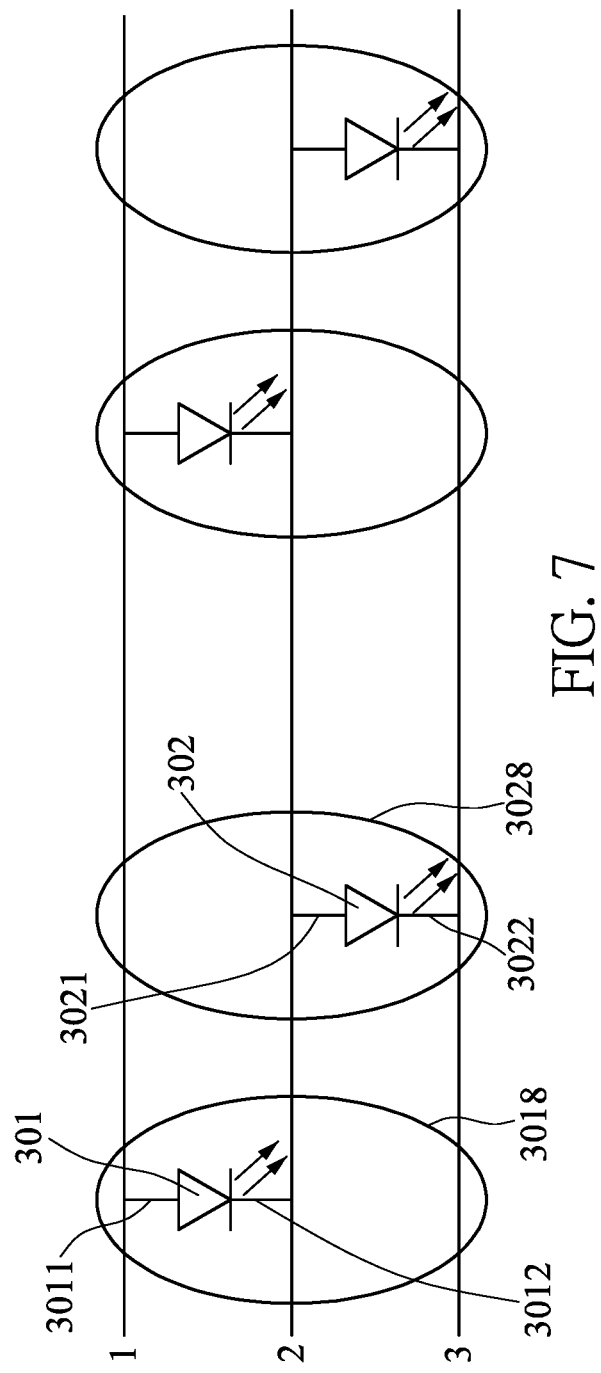
FIG. 7 is a circuit layout diagram of a fourth embodiment of a light strip of the present disclosure.

Referring to FIG. 7, a circuit layout diagram of a fourth embodiment of a light strip of the present disclosure is shown. As shown in FIG. 7, the light strip includes a first wire 1, a second wire 2 and a third wire 3, and a plurality of light-emitting elements such as a first light-emitting element 301 and a second light-emitting element 302. The first light-emitting element 301 includes a positive pin 3011 and a negative pin 3012. The second light-emitting element 302 includes a positive pin 3021 and a negative pin 3022. The positive pin 3011 of the first light-emitting element 301 is connected to the first wire 1, the negative pin 3012 of the first light-emitting element 301 and the positive pin 3021 of the second light-emitting element 302 are connected to the second wire 2, and the negative pin 3022 of the second-light-emitting element 302 is connected to the third wire 3. Therefore, in the embodiment, the light strip is an LED string including three wires forming two loops.

The conventional light strip uses wires each having a fixed polarity, for example, a LED strip including three wires forming a single loop, where the positive pins of all of the light-emitting elements are connected to the first wire, the negative pins of all of the light-emitting elements are connected to the third wire, and the second wire between the first wire and the third wire is used as an auxiliary wire for equalizing a voltage drop across each of the light-emitting diodes. In contrast, as described above, in the embodiment of the present disclosure, the positive pin of one of the light-emitting elements and the negative pin of another of the light-emitting elements are connected to the same wire, and the negative pin of the one light-emitting element and the positive pin of the another light-emitting element are connected to the different wires respectively. Therefore, in the embodiment of the present disclosure, the disadvantages of undesired emission, monotonous lighting effect, and single function of the conventional light device including wires having a common positive or negative polarity are improved by using the LED light strip including the three wires each having a non-fixed polarity to form two loops.

Figure 8:
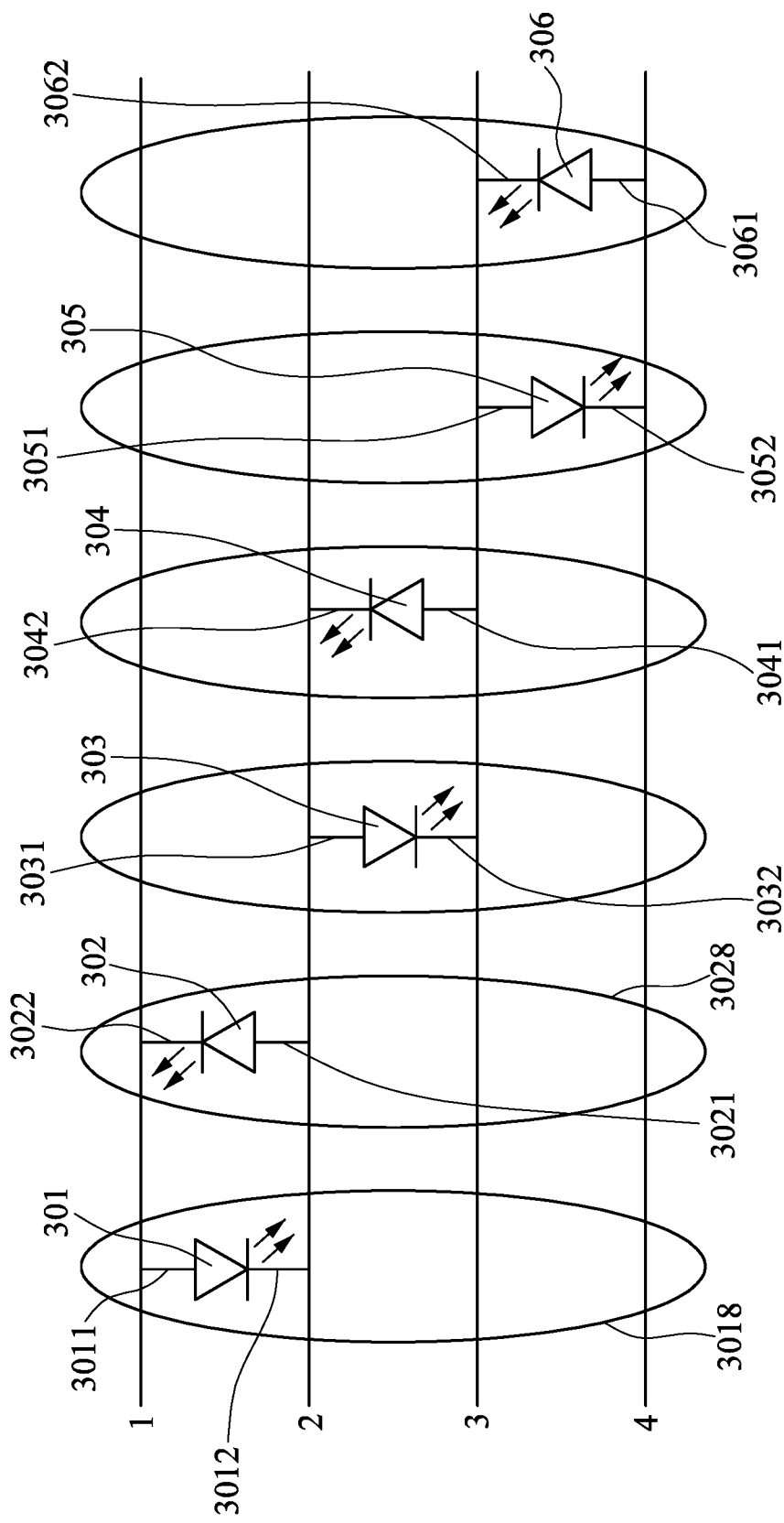
FIG. 8 is a circuit layout diagram of a fifth embodiment of a light strip of the present disclosure.

Referring to FIG. 8, a circuit layout diagram of a fifth embodiment of a light strip of the present disclosure is shown. As shown in FIG. 8, the light strip includes a first wire 1, a second wire 2, a third wire 3 and a fourth wire 4, and a first light-emitting element 301, a second light-emitting element 302, a third light-emitting element 303, a fourth light-emitting element 304, a fifth light-emitting element 305 and a sixth light-emitting element 306.

The first light-emitting element 301 includes a positive pin 3011 and a negative pin 3012. The second light-emitting element 302 includes a positive pin 3021 and a negative pin 3022. The third light-emitting element 303 includes a positive pin 3031 and a negative pin 3032. The fourth light-emitting element 304 includes a positive pin 3041 and a negative pin 3042. The fifth light-emitting element 305 includes a positive pin 3051 and a negative pin 3052. The sixth light-emitting element 306 includes a positive pin 3061 and a negative pin 3062.

The positive pin 3011 of the first light-emitting element 301 and the negative pin 3022 of the second light-emitting element 302 are connected to the first wire 1. The negative pin 3012 of the first light-emitting element 301, the positive pin 3021 of the second light-emitting element 302, the positive pin 3031 of the third light-emitting element 303, and the negative pin 3042 of the fourth light-emitting element 304 are connected to the second wire 2. The negative pin 3032 of the third light-emitting element 303 and the positive pin 3041 of the fourth light-emitting element 304, the positive pin 3051 of the fifth light-emitting element 305, and the negative pin 3062 of the sixth light-emitting element 306 are connected to the third wire 3. The negative pin 3052 of the fifth light-emitting element 305 and the positive pin 3061 of the sixth light-emitting element 306 are connected to the fourth wire 4. Therefore, in the embodiment, the light string includes four wires forming six loops.

The conventional light strip uses four wires each having a fixed polarity to form a signal loop, for example, the positive pins of all of the light-emitting elements are connected to the same wire such as a second wire, the negative pins of all of the light-emitting elements are connected to same wire such as a third wire, and other wires such as a first wire and a fourth wire on both sides of the first wire and third wire are used as auxiliary wires for improving an irradiation range of the light-emitting diodes. In contrast, as described above, in the embodiment of the present disclosure, the LED strip includes the four wires forming six loops, each of the wires has a non-fixed polarity to improve the disadvantages of undesired emission, monotonous lighting effect, and single function of the traditional light device including wires having a common positive or negative polarity.

In the above embodiments, the LED light string includes two wires forming two loops, three wires forming two loops or four wires forming six loops, respectively. However, it should be understood that the types, number, and configuration relationship of the wires and the light-emitting elements connected to the wires may be adjusted according to actual requirements to obtain the desired different circuit layouts, such as four wires forming three, four, five or twelve loops, etc. The light-emitting element may be a single LED chip, a double LED chip, or a plurality of LED chips according to the actual lighting requirements. For example, the plurality of light-emitting elements may emit light having colors such as red light, blue light and green light. In the embodiments of the present disclosure, the LED strips includes the plurality of loops formed by the plurality of wires each having a non-fixed polarity to provide a more diversified light-emitting effect, as compared with the conventional LED strips including wires each having a fixed polarity result in the disadvantages of undesired emission, monotonous lighting effect, and single function.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A stripping method, comprising:
   holding a first wire and a second wire wherein a conductor of the first wire is covered by an insulating layer of the first wire, and a conductor of the second wire is covered by an insulating layer of the second wire;
   detecting types of a positive pin and a negative pin of a light-emitting element;
   determining a type of a through hole of the first wire, according to the type of the positive pin of the light-emitting element;
   determining a type of a through hole of the second wire, according to the type of the negative pin of the light-emitting element;
   emitting a light beam to illuminate the insulating layer of the first wire, so that a portion of the insulating layer of the first wire is ablated to form the through hole of the first wire that penetrates the insulating layer of the first wire to expose a portion of the conductor of the first wire;
   emitting a light beam to illuminate the insulating layer of the second wire, so that a portion of the insulating layer of the second wire is ablated to form the through hole of the second wire that penetrates the insulating layer of the second wire to expose a portion of the conductor of the second wire;
   connecting the conductor of the first wire to the positive pin of the light-emitting element through the through hole of the first wire; and
   connecting the conductor of the second wire to the negative pin of the light-emitting element through the through hole of the second wire.

2. The stripping method of claim 1, further comprising:
   determining a location, a time, a depth and an area that the insulating layer of each of the first wire and the second wire is ablated; and
   adjusting a light intensity, an irradiation range, an irradiation angle and an irradiation time of the light beam, according to the location, the time, the depth and the area that each of the first wire and the second wire is ablated.

3. The stripping method of claim 1, further comprising:
   simultaneously or sequentially ablating parts of the insulating layer respectively at a plurality of segments of one of the first wire to form a plurality of through holes, and then simultaneously or sequentially ablating parts of the insulating layer at a plurality of segments of another of the first wire and the second wire to form a plurality of through holes respectively.

4. The stripping method of claim 1, further comprising: simultaneously ablating a first segment of each of the first wire and the second wire where the first segments are aligned with each other to form a first through hole at the first segment of each of the first wire and the second wire, and then simultaneously ablating a second segment of each of the first wire and the second wire where the second segments are aligned with each other to form a second through hole at the second segment of each of the first wire and the second wire.

5. The stripping method of claim 1, further comprising: detecting an ablation state of the insulating layer of each of the first wire and the second wire.

* * * * *